(12) United States Patent
Siores et al.

(10) Patent No.: US 9,287,492 B2
(45) Date of Patent: Mar. 15, 2016

(54) PIEZOELECTRIC POLYMER ELEMENT AND PRODUCTION METHOD AND APPARATUS THEREFOR

(75) Inventors: Elias Siores, Manchester (GB); Magundappa L. (Ravi) Hadimani, Bolton (GB)

(73) Assignee: University of Bolton, Bolton (GB)

( * ) Notice: Subject to any disclaimer, the term of this patent is extended or adjusted under 35 U.S.C. 154(b) by 290 days.

(21) Appl. No.: 13/823,908

(22) PCT Filed: Sep. 15, 2011

(86) PCT No.: PCT/GB2011/051734
§ 371 (c)(1),
(2), (4) Date: Apr. 25, 2013

(87) PCT Pub. No.: WO2012/035350
PCT Pub. Date: Mar. 22, 2012

(65) Prior Publication Data
US 2014/0145562 A1    May 29, 2014

(30) Foreign Application Priority Data
Sep. 15, 2010 (GB) .................................. 1015399.7

(51) Int. Cl.
*H01L 41/22* (2013.01)
*H01L 41/253* (2013.01)
(Continued)

(52) U.S. Cl.
CPC .............. *H01L 41/253* (2013.01); *B29C 55/18* (2013.01); *B29C 71/0081* (2013.01);
(Continued)

(58) Field of Classification Search
USPC .................................. 310/357–359; 29/25.35
See application file for complete search history.

(56) References Cited

U.S. PATENT DOCUMENTS 3,878,274 A * 4/1975 Murayama et al. ........... 264/1.36
4,079,437 A * 3/1978 Sheffield ....................... 361/233
(Continued)

FOREIGN PATENT DOCUMENTS

GB   2 123 602 A     2/1984
JP   56-126912    * 10/1981    .............. H01L 41/26
(Continued)

OTHER PUBLICATIONS

International Search Report corresponding to PCT/GB2011/051734 mailed Feb. 9, 2012 (4 pages).
(Continued)

*Primary Examiner* — Thomas Dougherty
(74) *Attorney, Agent, or Firm* — Leydig, Voit & Mayer, LTD

(57) ABSTRACT

A piezoelectric polymer element such as a fiber or film is described, having a solid cross-section and a substantially homogeneous composition. A method of forming such a piezoelectric polymer element is also described. The method has the steps of extruding a polymer material and concurrently poling a region of the extruded material. Apparatus for forming such a piezoelectric polymer element is also described that comprises an extruder for extruding a polymer element from a granular feed and a pair of electrodes for applying an electric field across a region of the element concurrently with its extrusion. Also described is a piezoelectric construct having such piezoelectric polymer elements interposed between two conductive layers. A system for converting mechanical energy into electrical energy is described in which each of the piezoelectric construct's two conductive layers is connected to a respective terminal of a rectifying circuit.

18 Claims, 2 Drawing Sheets

(51) Int. Cl.
- *B29C 55/18* (2006.01)
- *B29C 71/00* (2006.01)
- *H01L 41/18* (2006.01)
- *H01L 41/193* (2006.01)
- *H01L 41/45* (2013.01)
- *H02N 2/18* (2006.01)
- *H01L 41/257* (2013.01)
- *H01L 41/333* (2013.01)
- *B29C 47/00* (2006.01)
- *B29C 47/88* (2006.01)
- *B29K 23/00* (2006.01)
- *B29K 27/00* (2006.01)

(52) U.S. Cl.
CPC ........... *H01L 41/183* (2013.01); *H01L 41/193* (2013.01); *H01L 41/257* (2013.01); *H01L 41/333* (2013.01); *H01L 41/45* (2013.01); *H02N 2/18* (2013.01); *B29C 47/0021* (2013.01); *B29C 47/884* (2013.01); *B29C 47/8805* (2013.01); *B29C 47/8845* (2013.01); *B29K 2023/04* (2013.01); *B29K 2023/10* (2013.01); *B29K 2027/16* (2013.01)

(56) References Cited

U.S. PATENT DOCUMENTS

| | | | |
|---|---|---|---|
| 4,340,786 A | | 7/1982 | Tester |
| 5,505,870 A | * | 4/1996 | Yoo et al. ............... 252/62.9 PZ |
| 2005/0157893 A1 | | 7/2005 | Pelrine et al. |
| 2010/0068460 A1 | * | 3/2010 | Moriyama et al. ............ 428/155 |

FOREIGN PATENT DOCUMENTS

| | | | | |
|---|---|---|---|---|
| JP | 01-091412 | * | 4/1989 | ............ H01G 7/02 |
| JP | 2003-031865 | * | 1/2003 | ............ H01L 41/22 |
| JP | 2009103483 A | | 5/2009 | |
| WO | WO 01/63738 A2 | | 8/2001 | |
| WO | WO 2010/022158 A2 | | 2/2010 | |

OTHER PUBLICATIONS

Communication under Rule 71(3) EPC—Intention to Grant Application No. 11776823.4-1564, dated Jun. 18, 2014 (reference to U.S. 4,340,786: p. 2 within "Comments" section).

* cited by examiner

PIEZOELECTRIC POLYMER ELEMENT AND PRODUCTION METHOD AND APPARATUS THEREFOR

TECHNICAL FIELD OF THE INVENTION

The present invention relates to piezoelectric polymer elements such as fibres or films. The invention also relates to methods of forming piezoelectric polymer elements and to apparatus for forming piezoelectric polymer elements. The invention further relates to piezoelectric constructs comprising conductive layers and piezoelectric polymer fibres and to energy conversion systems incorporating such piezoelectric constructs.

BACKGROUND TO THE INVENTION

Piezoelectric materials have been widely used in various applications. Several attempts have been made to use them in the field of power generation, using ceramic piezoelectric materials with minimal success. Since the discovery of piezoelectricity in polymers in 1969, various application-based studies have been reported. Polymers are now well known candidates for piezoelectric material, having a charge displacement coefficient, $d_{33}$, of approximately 35 pC/N. Polymers and polymer blends are easy to melt extrude into thin films or fibres. They have a relatively low melting temperature (for example, polyvinylidene fluoride (PVDF) melts at around 175° C.) thus making them easier to process than ceramics. The availability of flexible polymers exhibiting highly piezoelectric behaviour, coupled with our increasing need for renewable energy, now makes the generation of electrical energy using piezoelectric materials an attractive option.

Previous work on polymers as piezoelectric materials has reported developments in thin film or bulk samples. Polymer fibres may have various potential applications, such as sensors, actuators, and energy scavenging devices. When the fibres are used in the form of two-dimensional structures, such as in textiles, or one-dimensional structures, such as ropes, the potential for new energy scavenging application is vast. Possible energy scavenging textile applications may include structures for harvesting mechanical energy from wind, rain, tidal, and waves for electrical power generation.

Previous work has included a proof of concept for an energy harvesting technique that uses macro-fibre composite (MFC). The MFC used in this work was a composite of piezoelectric lead zirconate titanate (PZT) fibres. Since PZT fibres are not flexible, they need to be prepared as composites for use as energy scavenging piezoelectric materials. On the other hand, polymer fibres are flexible, and can be used in making composite materials and two- and three-dimensional composite structures. Hence, they may be used in wider applications, especially if they may be manufactured more cost effectively than piezoelectric ceramics.

Previous work has included a complex multi-stage process for preparation of a piezoelectric copolymer fibre in a multi-layer construct. However, the fabrication method is complex, and requires many processing stages which may not be easily combined into a streamlined continuous production process.

Therefore, an aim of embodiments of the present invention is to provide an improved piezoelectric polymer element, such as a fibre or film, having a simple structure. Another aim of embodiments of the present invention is to provide an improved method for producing such a piezoelectric polymer element via a continuous process. A further aim of embodiments of the present invention is to provide apparatus for producing a piezoelectric polymer element using such an improved method. Further aims of embodiments of the invention are to provide a piezoelectric construct comprising such an improved piezoelectric polymer element for converting mechanical energy into electrical energy, and to provide a power conversion system comprising such a piezoelectric construct.

SUMMARY OF THE INVENTION

According to a first aspect of the present invention, there is provided a method of forming a piezoelectric polymer element having the steps of extruding a polymer material and concurrently poling a region of the extruded material.

This may offer a convenient formation process since the extrusion and poling are done concurrently.

Preferably, the element is a fibre. Alternatively, the element is a film.

The element is preferably extruded from a feed of polymer granules. The granules may comprise poly(vinylidene fluoride) or polypropylene or polyethylene. The granules may comprise a polymer with dispersed piezoelectric ceramic particles. The piezoelectric ceramic particles may be PZT or PMT-PT.

The element is preferably extruded from a melt extruder. The melt extruder may maintain the polymer at a first temperature above its melting point at a feed screw, and may maintain the polymer at a second, higher temperature at an extrusion die. In a preferred embodiment, the first temperature may be 20 degrees above melting point and the second temperature may be 30 degrees above melting point.

The extruded element may be cooled by an air blower. The region may be drawn across one or more cooled rolls prior to poling.

The region may be drawn across one or more heated rolls prior to poling. The region may preferably be heated to a temperature above its glass transition temperature and below its melting temperature. The region may be heated to between 60 and 90 degrees C. More preferably, the region may be heated to substantially 70 degrees C.

The region is preferably drawn under tension exceeding its yield stress to plastically extend said region prior to poling. The region may be plastically extended to reach an extension ratio of at least 2:1. More preferably, the extension ratio may be at least 3:1. More preferably, the extension ratio may be at least 4:1. More preferably, the extension ratio is substantially 4:1. Advantageously, the region may be extended to reach a thickness prior to poling of one quarter of its original thickness immediately after extrusion.

Poling comprises applying an electric field across said region. Preferably, the electric field may be between 0.5 MV/m and 1.5 MV/m. More preferably, the electric field may be between 1.0 MV/m and 1.3 MV/m. In one implementation, the electric field may be substantially 1 MV/m.

According to a second aspect of the present invention, there is provided an apparatus for forming a piezoelectric polymer element comprising an extruder for extruding said polymer element from a granular feed and a pair of electrodes for applying an electric field across a region of said element concurrently with the extrusion of the element.

The extruder is preferably a melt extruder. The melt extruder preferably maintains a first temperature at its feed screw above the melting point of the granular feed and a second, higher temperature at an extrusion die. In a preferred embodiment, the first temperature may be 20 degrees above the melting point and the second temperature may be 30 degrees above the melting point. The apparatus preferably includes an air blower. The apparatus may include water-cooled rollers. The apparatus may include heated rollers. Advantageously, the heated rollers may maintain a temperature above the glass transition temperature and below the melting point of the granular feed. Preferably, the temperature is between 60 and 90 degrees C. More preferably, the temperature is between 70 and 80 degrees C. Most preferably, the temperature is substantially 75 degrees C. The electrodes may advantageously apply an electric field of between 0.5 MV/m and 1.5 MV/m to said region. More preferably, the electrodes may apply an electric field of between 1.0 MV/m and 1.3 MV/m to said region. In one implementation, the electrodes may apply an electric field of substantially 1 MV/m to said region. Conveniently, the electrodes are connected to a high voltage power supply.

The second aspect of the present invention may incorporate any features of the first aspect of the invention, as desired or required.

According to a third aspect of the present invention, there is provided a piezoelectric polymer element having a solid cross-section and a substantially homogeneous composition throughout said cross-section.

Preferably, the element comprises poly(vinylidene fluoride) or polypropylene or polyethylene. The element may comprise a polymer with dispersed piezoelectric ceramic particles. The piezoelectric ceramic particles may be PZT or PMT-PT.

Advantageously, the element may be a fibre. Alternatively, the element may be a film.

The third aspect of the present invention may incorporate any features of the first or second aspects of the invention, as desired or required.

According to a fourth aspect of the present invention, there is provided a piezoelectric construct comprising two conductive layers and one or more piezoelectric polymer elements interposed between the conductive layers.

Advantageously, the conductive layers are metal. Conveniently, the conductive layers are Aluminium. Preferably, one or both of the conductive layers is a thin sheet, film, or foil. Conveniently, the one or more piezoelectric polymer elements comprise a plurality of fibres. Alternatively, the one or more piezoelectric polymer elements comprise at least one thin sheet or film.

The fourth aspect of the present invention may incorporate any features of the first, second, or third aspects of the invention, as desired or required.

According to a fifth aspect of the present invention, there is provided a system for converting mechanical energy into electrical energy comprising a piezoelectric construct having each of its two conductive layers connected to a terminal of a rectifying circuit.

Advantageously, the rectifying circuit may be connected to an energy storage device. Conveniently, the rectifying circuit may be connected to an electrical load.

The fifth aspect of the present invention may incorporate any features of the first, second, third, or fourth aspects of the invention, as desired or required.

DETAILED DESCRIPTION OF THE INVENTION

In order that the invention may be more clearly understood, embodiments thereof will now be described, by way of example only, with reference to the accompanying drawings, of which:

Figure 1:
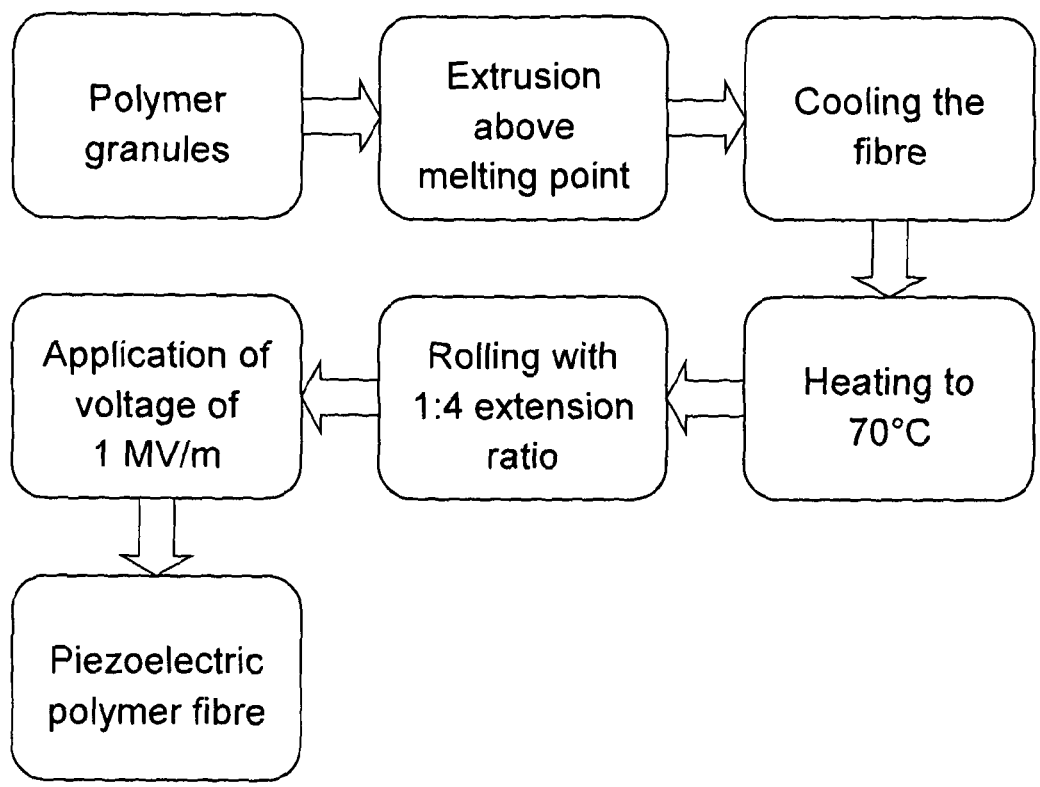
FIG. 1 is a flowchart showing stages of a method of producing a piezoelectric polymer element according to a first aspect of the present invention.
Figure 2:
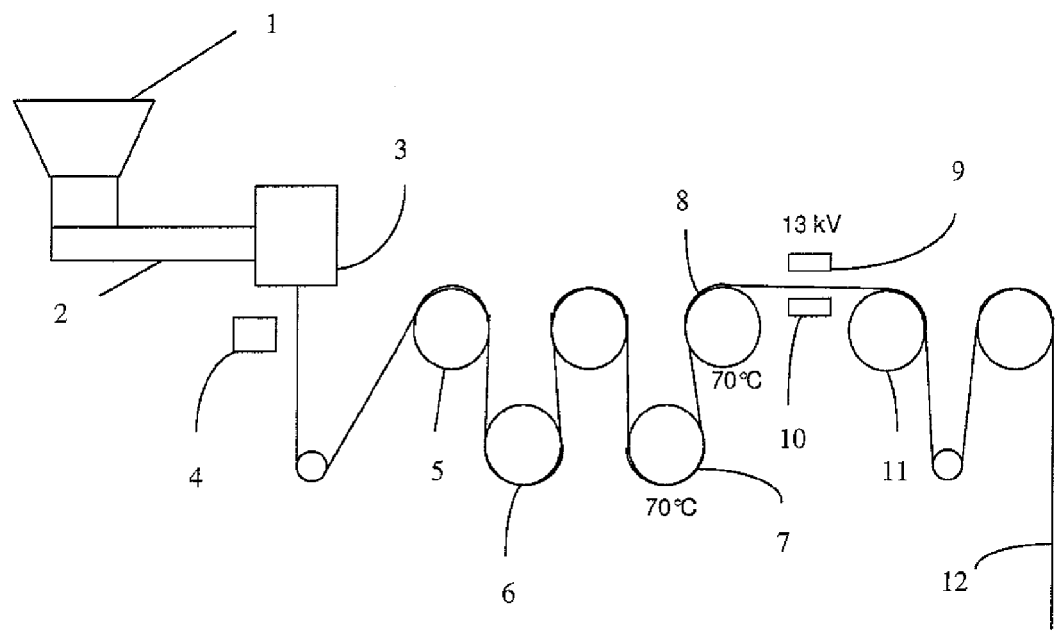
FIG. 2 is a schematic showing an apparatus according to a second aspect of the present invention for producing a piezoelectric polymer element according to the method of FIG. 1.
Figure 3:
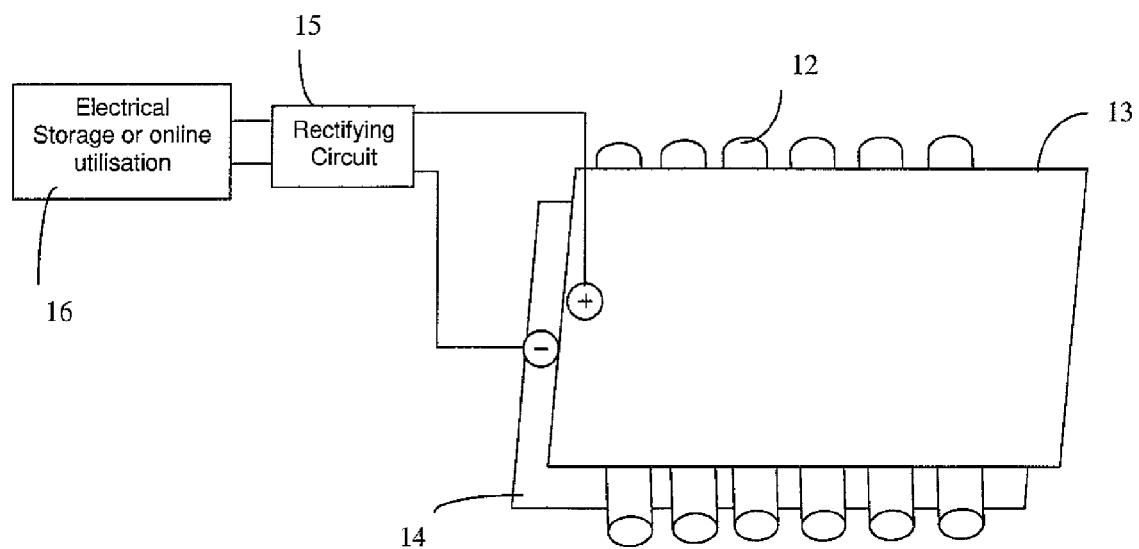
FIG. 3 is a schematic showing a system for converting mechanical energy into electrical energy according to another aspect of the present invention.

An embodiment of the invention is shown in FIG. 1, which sets out a process by which piezoelectric polymer fibres and films may be formed from raw material granules. Another embodiment is shown in FIG. 2, which shows apparatus for continuously carrying out such a process. This process may enable less expensive and/or less time-consuming methods of preparing piezoelectric polymer fibres, when compared with previously known methods. The process may require optimisation of melt-extrusion temperatures at various stages, cooling of melt-extruded fibres, feed rate of polymer granules and poling parameters such as the applied voltage, extension ratio (strain beyond yield point), and temperature during poling, as would be understood and practised by the skilled person. An example of such a fabrication process is described in detail in various steps below. The poled polymer fibres may be used to generate a voltage output when a mechanical stimulus is provided to the fibres, and vice versa.

In a preferred embodiment of the present invention, high purity polymer granules are used to feed (1) into the feed screw drive (2) of a melt extruder, to extrude a fibre or film. The speed of the screw should be carefully selected as it plays an important role in the final diameter of the fibre or film produced. Granular form of the feeding polymer is preferred, as it is best suited to the feed screw; other forms of feeding material, such as powder, may clog the feed screw more often. In one possible embodiment, a 4 mm monofilament die (3) is used for extruding a 2 mm-thick fibre. The extrusion temperature is kept 20° C. higher than the melting point of the polymer inside the feeding screw (2), and 30° C. higher at the die (3) where the fibre is extruded. The extruded fibre is then air cooled with a blower (4) while being rolled onward using the rollers. The initial stage rollers (5, 6) are water cooled, which helps to further cool the extruded fibre. The air speed of the blower and the water flow rate of the water-cooled rollers both determine the cooling rate of the fibre or film, and both should be adjusted to optimise the mechanical and microstructural properties of the extruded fibre, as would be apparent to the skilled person. In particular, either or both may be increased for any given increase in the fibre/film thickness, to maintain an optimal cooling rate.

Piezoelectric polarisation (poling) is required to induce piezoelectric behaviour in the extruded polymer. In a preferred embodiment, this is achieved by conveying the extruded fibre or film between a pair of charged electrodes concurrently with and downstream of the extrusion process. Temperature, strain (extension beyond yield), and applied electric field each play a crucial role in the degree of polarisation achieved. For example, in one embodiment of the present invention, in which a fibre or film is extruded from granular PVDF, the highest polarisation charge coefficient may be obtained by poling at a temperature of 70° C. and an extension ratio of 4:1; and by applying an electric field strength of approximately 1 MV/m. The poling temperature may be achieved by providing rollers (7, 8) that each contain a thermostatically controlled heating coil to achieve a desired temperature. In a preferred embodiment, the rollers (7, 8) are maintained at a temperature of 75° C., to obtain a polymer fibre/film temperature of 70° C. as it passes the rollers immediately prior to the poling stage. In one embodiment, a voltage of 13 kV is applied across a polymer fibre or film using a high voltage power supply as a region of the fibre or film passes between two metal electrodes (9, 10). The polymer fibre or film is stressed beyond its yielding point to obtain an extension ratio of 4:1, by maintaining a speed ratio of 4:1 on the winding rolls. When a 4 mm filament is stretched with a ratio of 4:1, the final diameter of the polymer structure (12) is reduced to 2 mm from 4 mm at the exit point of the die. When a 4 mm thick film is stretched with an extension ratio of 4:1, the final thickness of the film is reduced to 1 mm from 4 mm at the exit point of the die. These parameters are given by way of example only, and others may be suitable. Furthermore, for any combination of suitable parameters, each of the extension ration, poling temperature, and applied voltage is variable individually by varying either or both of the other two remaining properties (e.g. poling temperature may be reduced by few degrees either by increasing the applied voltage, or by increasing the extension ratio, or both).

The fibres or films produced by such a process may be embedded between two electrode layers to form a piezoelectric construct. In use, such a construct may be used to convert mechanical energy into electrical energy. In a preferred embodiment, piezoelectric polymer fibres (12) are embedded between two thin sheets of aluminium which serve as electrodes (13, 14). The fibres are closely packed to prevent the top electrode (13) from making contact with the bottom electrode (14). The top and bottom electrodes act as positive and negative terminals for the energy-generating polymer piezoelectric device. In a preferred embodiment, a rectifying circuit (15), such as a bridge rectifier comprising four diodes and a capacitor, is employed to rectify the fluctuating voltage of various frequencies produced by the piezoelectric construct under varying mechanical stimuli, to produce a more steady DC voltage output. The rectified voltage output can then feed an electrical storage device (16) such as one or more batteries or super-capacitors, or can be utilised online by direct connection to an electrical load, or both.

The above embodiments are described by way of example only. As would be apparent to the skilled person, many variations are possible without departing from the scope of the invention.

The invention claimed is:

1. A method of forming a piezoelectric polymer element, the method having the steps of extruding a polymer material and concurrently poling a region of the extruded material, wherein the region is drawn across one or more heated rollers prior to poling.

2. A method according to claim 1 wherein the element is extruded from a melt extruder and wherein the polymer is maintained at a first temperature that exceeds the melting point of the polymer at a feed screw of the extruder, and a second, higher temperature at an extrusion die of the extruder.

3. A method according to claim 2 wherein the first temperature is about 20 degrees above the melting point of the polymer.

4. A method according to claim 2 wherein the second temperature is about 30 degrees above the melting point of the polymer.

5. A method according to claim 1 wherein the region is heated to a temperature between the glass transition temperature and the melting temperature of the polymer.

6. A method according to claim 1 wherein the region is heated to between 60 and 90 degrees C.

7. A method according to claim 1 wherein the region is drawn under tension exceeding its yield stress to plastically extend said region prior to poling.

8. A method according to claim 1 wherein the region is plastically extended with an extension ratio of at least 2:1.

9. A method according to claim 1 wherein poling comprises applying an electric field of between 0.5 MV/m and 1.5 MV/m across said region.

10. An apparatus for forming a piezoelectric polymer element, the apparatus comprising an extruder for extruding said polymer element from a granular feed, a pair of electrodes for applying an electric field across a region of said element concurrently with the extrusion of the element, and one or more heated rollers arranged for said region to be drawn across the rollers prior to application by the electrodes of an electric field across said region.

11. An apparatus according to claim 10 wherein the extruder is a melt extruder having a feed screw and an extrusion die, the melt extruder maintaining a first temperature at the feed screw above the melting point of the granular feed and a second, higher temperature at the extrusion die.

12. An apparatus according to claim 11 wherein the first temperature is about 20 degrees above said melting point and the second temperature is about 30 degrees above said melting point.

13. An apparatus according to claim 10 wherein the heated rollers are maintainable at a temperature above the glass transition temperature and below the melting point of the granular feed.

14. An apparatus according to claim 10 wherein the heated rollers are maintainable at a temperature between 60 and 90 degrees C.

15. An apparatus according to claim 10 wherein the electrodes apply an electric field of between 0.5 MV/m and 1.5 MV/m to said region.

16. A piezoelectric polymer element formed according to the method of claim 1, comprising a polymer with dispersed piezoelectric ceramic particles, and having a solid cross-section and a substantially homogeneous composition throughout said cross-section.

17. A piezoelectric construct comprising one or more piezoelectric polymer elements according to claim 16 interposed between two conductive layers.

18. A system for converting mechanical energy into electrical energy comprising a piezoelectric construct according to claim 17 wherein each of the two conductive layers are connected to a respective terminal of a rectifying circuit.

* * * * *